United States Patent
Eggert et al.

(10) Patent No.: US 11,043,643 B2
(45) Date of Patent: Jun. 22, 2021

(54) CROSSLINKABLE POLYMERIC MATERIALS FOR DIELECTRIC LAYERS IN ELECTRONIC DEVICES

(71) Applicant: ALTANA AG, Wesel (DE)

(72) Inventors: Martin Eggert, Hamburg (DE); Stephan Feser, Hamburg (DE); Sascha Tödter-König, Hamburg (DE)

(73) Assignee: ALTANA AG, Wesel (DE)

( * ) Notice: Subject to any disclaimer, the term of this patent is extended or adjusted under 35 U.S.C. 154(b) by 0 days.

(21) Appl. No.: 15/773,881

(22) PCT Filed: Nov. 15, 2016

(86) PCT No.: PCT/EP2016/077757
§ 371 (c)(1),
(2) Date: May 4, 2018

(87) PCT Pub. No.: WO2017/085070
PCT Pub. Date: May 26, 2017

(65) Prior Publication Data
US 2018/0323386 A1     Nov. 8, 2018

(30) Foreign Application Priority Data
Nov. 18, 2015 (DE) .................... 10 2015 119 939.4

(51) Int. Cl.
*H01L 51/05* (2006.01)
*C08F 12/32* (2006.01)
(Continued)

(52) U.S. Cl.
CPC ............ *H01L 51/052* (2013.01); *C08F 12/18* (2013.01); *C08F 12/32* (2013.01); *C08F 20/22* (2013.01);
(Continued)

(58) Field of Classification Search
CPC . H01L 51/052; H01L 51/004; H01L 51/0043; H01L 28/40; C08F 12/32; C08F 20/28; C08F 20/40
See application file for complete search history.

(56) References Cited

U.S. PATENT DOCUMENTS

| | | | |
|---|---|---|---|
| 3,650,669 A | * | 3/1972 | Osborn ................. C08F 2/46 8/115.52 |
| 6,313,250 B1 | | 11/2001 | Blum et al. |

(Continued)

FOREIGN PATENT DOCUMENTS

| | | |
|---|---|---|
| CN | 101370889 A | 2/2009 |
| CN | 101470350 A | 7/2009 |

(Continued)

OTHER PUBLICATIONS

Computer-generated English-language translation of JP 2011022509 A to Kondo et al.*

(Continued)

*Primary Examiner* — Vu A Nguyen
(74) *Attorney, Agent, or Firm* — Fitch, Even, Tabin & Flannery LLP

(57) ABSTRACT

Compositions for providing a dielectric layer in an electronic device wherein the composition comprises a polymer
(Continued)

which polymer contains one or more building blocks, wherein at least 25 mol % of the total number of building blocks in the polymer are of the general formula having olefinic oligo-dihydrodicyclopentadienyl functionalities.

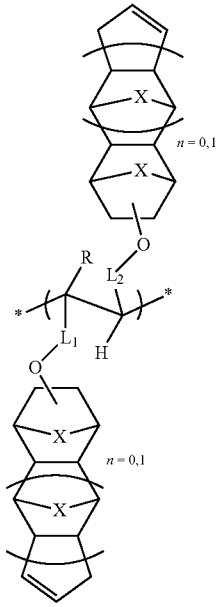

10 Claims, 4 Drawing Sheets

(51) Int. Cl.
C08F 20/28 (2006.01)
C08F 20/40 (2006.01)
C08F 12/18 (2006.01)
C08F 20/22 (2006.01)
H01L 51/00 (2006.01)
H01L 49/02 (2006.01)

(52) U.S. Cl.
CPC ............ C08F 20/28 (2013.01); C08F 20/40 (2013.01); H01L 51/004 (2013.01); H01L 51/0043 (2013.01); H01L 28/40 (2013.01)

(56) References Cited

U.S. PATENT DOCUMENTS

| | | | |
|---|---|---|---|
| 7,186,454 B2 | 3/2007 | Nagano et al. | |
| 7,364,833 B2 | 4/2008 | Lee et al. | |
| 8,853,820 B2 | 10/2014 | Kastler et al. | |
| 9,082,981 B1 | 7/2015 | Lu et al. | |
| 2007/0184293 A1 | 8/2007 | Lee et al. | |
| 2008/0067503 A1 | 3/2008 | Kim et al. | |
| 2011/0112266 A1* | 5/2011 | Takawaki | C08F 232/08 526/262 |
| 2011/0215334 A1 | 9/2011 | Quinn et al. | |
| 2015/0041735 A1 | 2/2015 | Wang et al. | |
| 2015/0353665 A1 | 12/2015 | Minakuchi et al. | |
| 2015/0355365 A1 | 12/2015 | Carelli et al. | |

FOREIGN PATENT DOCUMENTS

| | | | |
|---|---|---|---|
| CN | 104245783 A | 12/2014 | |
| CN | 104641471 A | 5/2015 | |
| EP | 329441 A1 | 8/1989 | |
| EP | 2308905 A1 | 4/2011 | |
| EP | 2089442 B1 | 10/2014 | |
| EP | 2368281 B1 | 5/2015 | |
| JP | S 56-010508 A | 2/1981 | |
| JP | 58117207 U | 7/1983 | |
| JP | S 58-224301 A | 12/1983 | |
| JP | 2000504363 A | 4/2000 | |
| JP | 2002317021 A | 10/2002 | |
| JP | 2004534107 A | 11/2004 | |
| JP | 2005338831 A | 12/2005 | |
| JP | 2007224293 A | 9/2007 | |
| JP | 2007251093 A | 9/2007 | |
| JP | 2008088394 A | 4/2008 | |
| JP | 2009075553 A | 4/2009 | |
| JP | 2009-122549 A | 6/2009 | |
| JP | 2009122533 A | 6/2009 | |
| JP | 2009175647 A | 8/2009 | |
| JP | 2009175730 A | 8/2009 | |
| JP | 2009221275 A | 10/2009 | |
| JP | 2009258353 A | 11/2009 | |
| JP | 2009265630 A | 11/2009 | |
| JP | 2010031091 A | 2/2010 | |
| JP | 2010262259 A * | 11/2010 | |
| JP | 2010262259 A | 11/2010 | |
| JP | 2011022509 A | 2/2011 | |
| JP | 2011022509 A * | 2/2011 | |
| JP | 2013028706 A | 2/2013 | |
| JP | 2013117716 A | 6/2013 | |
| JP | 2014065873 A | 4/2014 | |
| JP | 2014514602 A | 6/2014 | |
| JP | 2015025892 A | 2/2015 | |
| JP | 2015096591 A | 5/2015 | |
| WO | 02073307 A2 | 9/2002 | |
| WO | 2009047949 A1 | 4/2009 | |
| WO | 2009063955 A1 | 5/2009 | |
| WO | 2009098996 A1 | 8/2009 | |
| WO | 2012028279 A1 | 3/2012 | |
| WO | 2012059386 A1 | 5/2012 | |

OTHER PUBLICATIONS

Computer-generated English-language translation of JP 2010262259 A to Hikita.*
Machine-generated English-language translation of JP 2009175730 A to Fukushige et al. (Year: 2009).*
Machine-generated English-language translation of JP 2009122533 A to Fukushige et al. (Year: 2009).*
Machine-generated English-language translation of JP 58-117207 A to Ikeno et al. (Year: 1983).*
Hitachi Chemical Fancryl Catalog, Jul. 2011. (Year: 2011).*
Kamei and Nagai's "Synthesis of Dicyclopentenyl (Meth)acrylate and Application of UV Curable Resin," Journal of Network Polymer, Japan, vol. 37, No. 6, 2016, pp. 236-241. Available online at https://www.jstage.jst.go.jP/article/networkpolymer/37/6/37_236/_article/-char/en (Year: 2016).*
International Search Report and Written Opinion for International Application No. PCT/EP2016/077757 dated Feb. 2, 2017.

* cited by examiner

CROSSLINKABLE POLYMERIC MATERIALS FOR DIELECTRIC LAYERS IN ELECTRONIC DEVICES

All of the documents cited in the present patent application are incorporated by reference in their entirety into the present disclosure.

The present invention relates to crosslinkable polymers, dielectric layers comprising them, electronic devices, more particularly organic field-effect transistors, comprising them.

PRIOR ART

Organic field-effect transistors (OFETs) are electronic devices which find application in flexible displays, sensor devices or electronic circuits.

An OFET is a multilayer device which comprises a substrate, a source electrode and drain electrode, an organic semiconductor layer, a dielectric layer and a gate electrode. The semiconductor layer typically comprises an organic polymer and/or a small molecule.

Depending on the arrangement of the layers in an OFET, a distinction is made between a top gate and a bottom gate configuration. In the top gate configuration, the semiconductor layer is followed by the dielectric and lastly by the gate electrode. In the bottom gate configuration, the layer arrangement is in the opposite order (see FIG. 1 and FIG. 2).

OFETs are processed preferably by coating (e.g. spin coating or slot die) or printing (e.g. ink-jet or gravure) processes from solution, allowing large-area processing at low temperatures on flexible polymeric substrates such as PET film, for example.

In the multilayer processing of a transistor from solution, it is critical that the underlying layer is not partly dissolved by the processing of the following layer. Therefore, either the underlying layer must be converted into an insoluble state, or the process solvent of the following layer must be orthogonal to the underlying layer.

Crosslinkable dielectric materials which can be processed from solution are preferred, since their layers are converted into an insoluble state by crosslinking and, moreover, can be patterned by photolithography.

WO 2012/059386 describes a process for producing a transistor where the dielectric comprises a photocurable polyimide. Polyimides do indeed have excellent dielectric properties, but their limited solubility means that they can often only be applied from incompatible solvents such as N-methyl-2-pyrrolidone (NMP).

U.S. Pat. No. 8,853,820 B2 describes radically crosslinkable polymers having acrylate side groups and alkyd resins which find preferred use as a dielectric in OFETs.

WO 2012/028279 relates to use of polycycloolefins, primarily as dielectrics in OFETs. The patent describes preferred polymers which are crosslinked via sensitized photodimerization of maleimide-functionalized side chains. Polycycloolefins, such as polynorbornenes, for example, do have excellent dielectric properties, but the adhesion is often limited on account of their high glass transition temperature, especially on non-polar organic semiconductor films. In the patent, this difficulty is resolved through the additional use of crosslinkable adhesion promoters. Generally speaking, however, this entails an additional process step.

EP 2 089 442 describes polymers having cinnamate side groups, which are crosslinked by photodimerization and are used preferably as a dielectric in OFETs.

EP 2 368 281 (corresponds to U.S. Pat. No. 8,937,301) describes vinyl polymers which are crosslinked by photodimerization of coumarin side groups and find application preferably in OFETs as a dielectric.

Under continual exposure to UV light, however, these photodimerization reactions of cinnamates and coumarins are considered to be reversible.

JP2011022509 describes a photosensitive composition for an organic insulating film. These resins are used as insulating film in electroluminescent displays and LCD-devices. The resin compositions are alkali soluble and comprise a cationic curing catalyst. These compositions are not suited for use as UV-cured dielectric layers in OFET devices.

EP329441 describes UV-curable conformal coatings for use in coating printed wire boards, to protect the printed wire board from the environment. A mixture of monomers is applied to a substrate and then cured using UV-radiation. The resin compositions are not suited for use as dielectric layers in OFET devices.

US2015/0041735 describes a photosensitive composition for use in LCD-devices. A photosensitive resin for a colour filter is applied to a substrate and then cured using UV-radiation. The resin compositions are not suited for use as dielectric layers in OFET devices.

US2015/03553665 describes insulating materials for improving the performance of organic field effect transistors. This document does not disclose or suggest the use of polymers comprising olefinic dihydrodicyclopentadienyl functionalities in the preparation of dielectric layers in these devices.

The invention is based on the finding that aliphatic polymers can be efficiently crosslinked by means of olefinic dihydrodicyclopentadienyl (DCPD) functionalities in the side chain. Moreover, the non-polar DCPD side groups promote wetting and adhesion on hydrophobic semiconductor polymers, and unwanted dipolar interactions at the semiconductor interface are minimized, such interactions possibly influencing the device performance of the OFET.

Problem

A problem addressed by the present invention is that of providing new, optionally irreversibly crosslinkable polymers which do not have the disadvantages of the prior art. The polymers are to be suitable as a constituent, optionally the sole constituent, of dielectric layers, preferably for electronic devices, more particularly for organic field-effect transistors (OFETs), are to be soluble in compatible solvents, i.e. process solvents whose following layer is orthogonal to an underlying layer, such as esters and ketones, and are to adhere effectively to and be compatible with organic semiconductor layers.

A further problem addressed by the present invention was that of providing new dielectric substances which are an improvement in comparison to the prior art.

An additional problem addressed by the present invention was that of providing improved electronic devices, more particularly OFETs.

Solution

These problems are solved by aliphatic polymers having olefinic dihydrodicyclopentadienyl (DCPD) functionalities in this side chain, by dielectric layers comprising or consisting of these polymers, by electronic devices comprising these dielectric layers, and by use of the polymers, dielectric layers and devices.

Definitions of Terms

For the purposes of the present invention, all quantity details, unless indicated otherwise, are to be understood as weight details.

For the purposes of the present invention, the term "room temperature" means a temperature of 20° C. Temperature details are in degrees Celsius (° C.) unless otherwise indicated.

Unless otherwise indicated, the stated reactions or process steps are carried out under standard/atmospheric pressure, i.e. at 1013 mbar.

For the purposes of the present invention, the formulation "and/or" includes not only any desired combination but also all combinations of the elements stated in the list in question.

For the purposes of the present invention, the term "photoinitiator", unless otherwise indicated, refers both to photosensitizers and to photoinitiators in the narrower sense.

The expression (meth)acrylic is intended for the purposes of the present invention to encompass both methacrylic and acrylic and also mixtures of both.

Actinic radiation, here and hereinafter, refers to electromagnetic radiation, such as infrared, near infrared, visible light, UV radiation or X-radiation, more particularly UV radiation, or particulate radiation, such as electron radiation.

DETAILED DESCRIPTION

The invention is based on the finding that aliphatic polymers can be efficiently crosslinked by means of olefinic dihydrodicyclopentadienyl (DCPD) functionalities in the side chain. Moreover, the non-polar DCPD side groups promote wetting and adhesion on hydrophobic semiconductor polymers, and unwanted dipolar interactions at the semiconductor interface are minimized, such interactions possibly influencing the device performance of the OFET.

A first subject of the present invention is a composition for providing a dielectric layer in an electronic device which composition comprises a polymer which polymer contains one or more units, wherein at least 25 mol % of the total number of units in the polymer are the following units (A) with pendant oligodihydrocyclopentadienyl side groups,

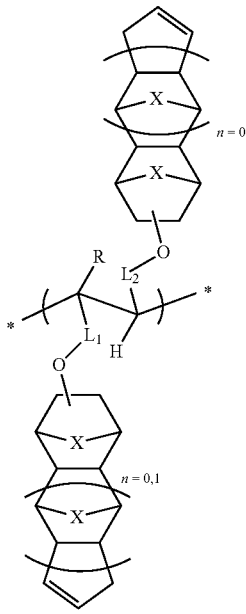

in which
- X independently at each occurrence is a methylene group or oxygen,
- R independently at each occurrence is a methyl group or hydrogen,
- $L_1$ is a divalent group which connects the polymer chain to the side group and
- $L_2$ is a divalent group which connects the polymer chain to the side group, or is hydrogen,
  with the proviso that if $L_2$ is hydrogen, the side group in question is absent.

In one variant of the present invention, the divalent groups $L_{1,2}$ are selected independently of one another from the group consisting of carbonyl, phenyl, benzyl, carbonyloxyethyl, carbonyloxyisopropyl and carbonyloxyethylamide groups, and more particularly the divalent groups $L_{1,2}$ are selected independently of one another from the group consisting of carbonyl and carbonyloxyethyl groups.

A further subject of the present invention is an organic field-effect transistor which comprises a dielectric layer which has a crosslinked composition of the invention.

The invention further relates to a method for producing the electronic device and also to the use thereof for thin-film capacitors.

The invention further relates to a process for the preparation of an organic field-effect transistor by using a polymer having units with pendant oligodihydrocyclopentadienyl side groups wherein the polymer is crosslinked using UV radiation The polymer used in the composition of the present invention having units of the structure (A) is prepared using preferably monomers selected from the group consisting of the following monomers

1.

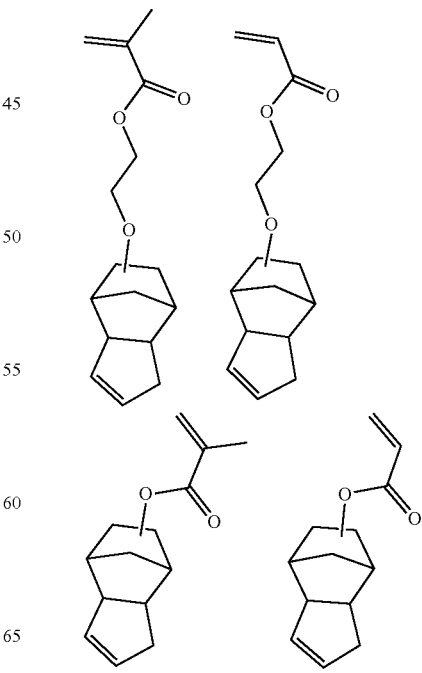

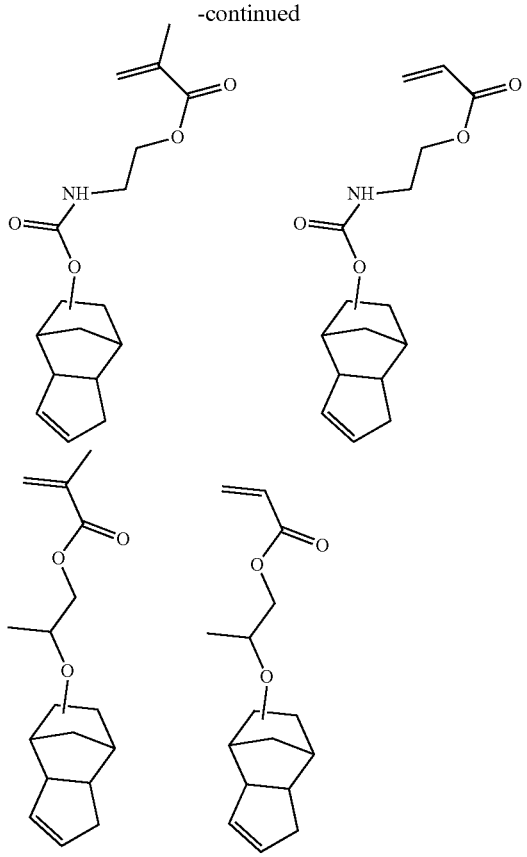

2.

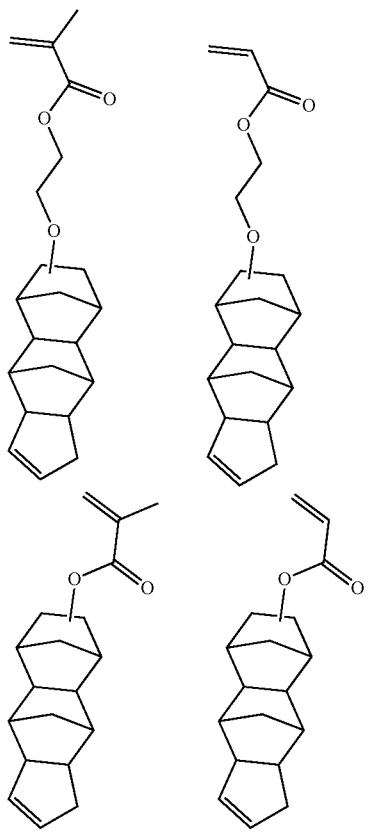

or mixtures of these monomers.

In place of these listed (meth)acrylate monomers it is also possible for analogous vinyl and vinylbenzyl monomers to be used for preparing a polymer in accordance with the invention.

As monomers it is additionally possible to use polymerizable derivatives of oligodihydrocyclopentadiene, examples being esters or diesters of the corresponding alcohol with unsaturated acids, preferably selected from the group consisting of maleic acid, fumaric acid, itaconic acid, sorbic acid, cinnamic acid, abietic acid and mixtures thereof.

It is possible, moreover, to use comonomers when preparing the polymers of the invention.

The use of comonomers makes it possible to adapt more effectively the physicochemical properties of the polymer such as the glass transition temperature ($T_G$), solubility, surface wetting, adhesion, dielectric permittivity, etc.

Monomers producing the unit of the structure (A) are preferably copolymerized with monomers selected from the group consisting of methyl methacrylate, ethyl methacrylate, (iso)propyl methacrylate, n-butyl methacrylate, tert-butyl methacrylate, ethylhexyl methacrylate, isooctyl methacrylate, tridecyl methacrylate, cetyl methacrylate, stearyl methacrylate, lauryl methacrylate, allyl methacrylate, cyclohexyl methacrylate, 2-isobornyl methacrylate, 4-tert-butyl-cyclohexyl methacrylate, 1-adamantyl methacrylate, 2-methyl-2-adamantyl methacrylate, phenyl methacrylate, benzyl methacrylate, hexafluoroisopropyl methacrylate, octafluoropentyl methacrylate, pentafluorophenyl methacrylate and mixtures thereof.

With the following comonomers of high polarity it is possible to increase the dielectric permittivity of the polymers of the invention, which is why they are incorporated by copolymerization in one variant of the present invention:

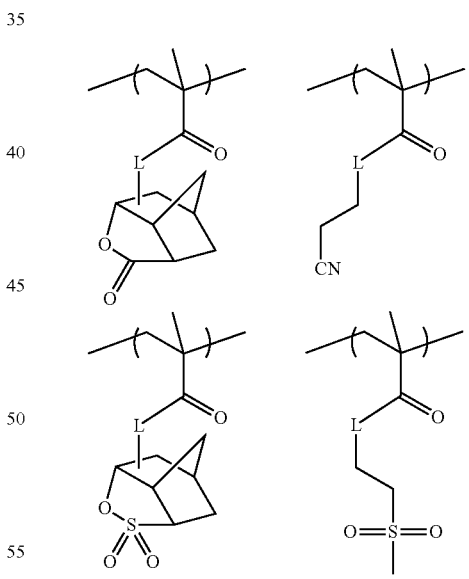

where

L is absent, -ethyloxy, -isopropyloxy or -ethylamidoxy.

In place of the listed methacrylate comonomers it is possible as well to use analogous acrylate, vinyl and vinylbenzyl monomers for preparing the polymers of the invention.

In one variant of the present invention, the polymers of the invention contain at least 35 mol % of the units (A), preferably 50 to 100 mol %, determined by means of $^1$H-NMR spectroscopy.

In one variant of the present invention, the polymers of the invention have no coumarin groups. In one variant of the present invention, the polymers of the invention have no cinnamate groups.

The polymers used in accordance with the invention may be prepared via customary polymerization processes.

Customary polymerization processes include free radical polymerization with radical initiators, or controlled free radical polymerizations such as ATRP (Atom Transfer Radical Polymerization), RAFT (Reversible Addition Fragmentation Chain Transfer) or NMP (Nitroxide Mediated Polymerization).

The polymers used in accordance with the invention preferably have an average molecular weight (MW) of 10 000 to 2 000 000 Daltons, more preferably of 50 000 to 500 000 Daltons, determined by means of gel permeation chromatography (GPC).

Furthermore, the polymers used in accordance with the invention may also be prepared by polymer-analogous reactions of commercially available polymers with hydroxydicyclopentadiene (DCPD-OH).

Polymers particularly suitable for such reactions are those having acid or acid anhydride groups which can be esterified with DCPD-OH.

In one variant of the present invention, this is done using polymers selected from the group consisting of poly(styrene-co-maleic anhydride), poly(ethylene-co-maleic anhydride), poly(vinyl methyl ether-co-maleic anhydride), poly(octadecene-co-maleic anhydride), polyacrylic acid, polymethacrylic acid and mixtures thereof.

Another possibility for polymer-analogous reaction which can be used in one variant of the present invention comes about through nucleophilic substitution reactions of the DCPD-OH alkoxide with—for example—polymers such as polyvinylbenzyl chloride.

Monomers used in one variant of the present invention as monomers forming the structure (A) are dicyclopentenyloxyethyl methacrylate or dicyclopentenyl methacrylate or dicyclopentenyloxyethyl methacrylate and dicyclopentenyl methacrylate and comonomers used are those selected from the group consisting of 5-methacryloyloxy-2,6-norbornanecarbolactone, methyl methacrylate, octafluoropentyl methacrylate, stearyl methacrylate and mixtures thereof.

In another variant of the present invention, the polymers used in accordance with the invention are obtained from the reaction of styrene-co-maleic anhydride with hydroxydicyclopentadiene and dicyclopentadiene, or from the reaction of polyvinylbenzyl chloride with hydroxy-dicyclopentadiene.

In the variants of the present invention in which the polymers used in accordance with the invention not only consist of the repeating units (A) but in which comonomers are incorporated by polymerization, the copolymers may be, for example, alternating copolymers, random copolymers, gradient copolymers, block copolymers, segment copolymers, graft copolymers and/or comb polymers.

Preferred polymers used in accordance with the invention are the polymers 1 to 8 represented by the formulae below (polymers 3 to 8 are copolymers, in which the different repeating units have been set apart from one another in the formula images below only for greater legibility):

Polymer 1

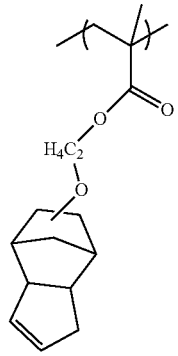

Polymer 2

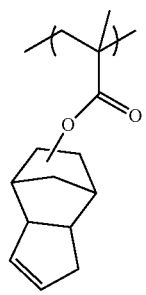

Polymer 3

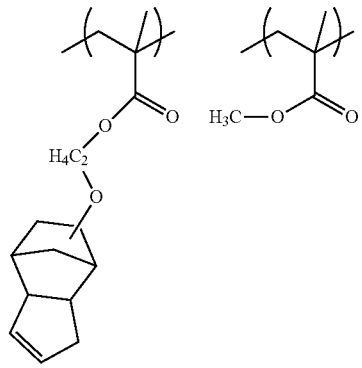

Polymer 4

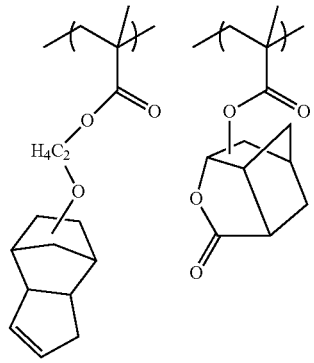

Polymer 5

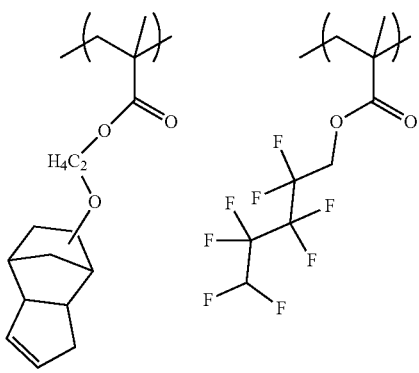

Polymer 6

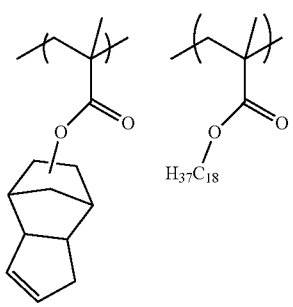

Polymer 7

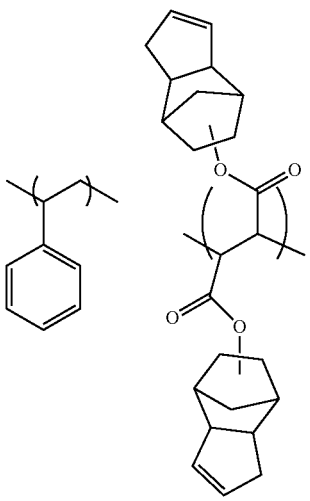

Polymer 8

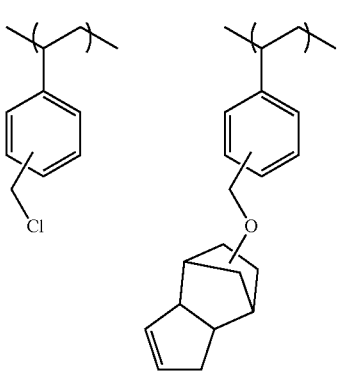

The polymers used in accordance with the invention may be processed to form dielectric layers used in accordance with the invention. This layer comprises or consists of
a) one of the above-described polymers,
b) optionally a further polymer, preferably methacrylate polymers,
c) optionally further additives, such as free radical photoinitiators, stabilizers, optionally adhesion promoters.

For application of the dielectric layer to a substrate, the polymer of the invention is provided in solution in a solvent. Within the solution, the fraction of the polymer in relation to the solvent is preferably 1-40 percent by mass, more preferably 5-15 percent by mass.

The solution may further comprise a photoinitiator, whose fraction in relation to the polymer is preferably 0.2-15 percent by mass, more preferably 0.5-4 percent by mass.

In one variant of the present invention, the solution may further comprise antioxidants and radical scavengers such as butylated hydroxytoluene, for example, in order to increase the storage stability.

For the purposes of the present invention it is possible to employ substantially all solvents, provided that sufficient solubility of the polymer and other devices of the formulation is ensured. Solvents may be used both individually and also in a combination of two or more.

Preferred for use for the purposes of the present invention are solvents selected from the group consisting of esters, ketones, ethers, (cyclo)aliphatic and aromatic solvents and mixtures of these.

In one variant of the present invention the solvents are selected from the group consisting of ethyl acetate, isopropyl acetate, propyl acetate, butyl acetate, isobutyl acetate, n-amyl acetate, isoamyl acetate, 2-ethylhexyl acetate, cyclohexyl acetate, isopropyl isopropionate, isopropyl propionate, isobutyl isopropionate, butyl isopropionate, amyl propionate, isopropyl isobutyrate, isopropyl butyrate, isobutyl isobutyrate, butyl isobutyrate, methyl lactate, ethyl lactate, ethylene glycol diacetate, propylene glycol monomethyl ether acetate, gamma-butyrolactone, propylene carbonate, and ethyl 3-ethoxypropionate, Shellsol D25, tetrahydrofuran, toluene, anisole, acetone, methyl ethyl ketone, methyl propyl ketone, methyl isobutyl ketone, methyl amyl ketone, methyl isoamyl ketone, cyclopentanone, cyclohexanone, diisobutyl ketone, diacetone alcohol and mixtures thereof.

The compositions of the invention for producing dielectric layers may in one variant comprise radical polymerization initiators which are activated by actinic radiation such as gamma radiation, E-beam, UV radiation, visible light or infrared radiation.

Radical polymerization initiators in one variant of the present invention are selected from the group consisting of acetophenone compounds, benzophenone compounds, thioxanthone compounds, xanthone compounds, keto-coumarin compounds, oxime ester compounds, halomethyl-triazine compounds, hexaarylbiimidazole compounds, phosphine compounds, ketal compounds and mixtures thereof.

In the presence of DCPD groups, Norrish type II initiators such as thioxanthone compounds, for example, require no additional hydrogen donors, such as tertiary amines or thiols, for example, since there is direct allylic hydrogen abstraction on the DCPD.

In one variant of the present invention, the photoinitiators are selected from the group consisting of benzophenone, 2-ethylanthraquinone, thioxanthone, 2-,4-isopropylthioxanthone (isomers), 2-chlorothioxanthone, 1-chloro-4-propoxythioxanthone, 2-trifluoromethylthioxanthone, 2,4-bis (trichloromethyl)-6-methoxystyryl-s-triazine, (2,4,6-trimethylbenzoyl)-diphenylphosphine oxide, bis(2,4,6-trimethylbenzoyl)-phenylphosphine, 2,2'-bis(o-chlorophenyl)-4,4',5,5'-tetraphenyl-1,2-biimidazole, 4-)-4'-methylphenylthio)benzophenone, 1-hydroxycyclohexyl phenyl ketone, 2-(4-methylbenzyl)-2-(dimethylamino)-4-morpholinobutyrophenone), 1-[9-ethyl-6-(2-methylbenzoyl)-9H-carbazol-3-yl]ethanone 1(O-acetyloxime) (OXE02), 2-(O-benzoyloxime)-1-[4-(phenylthio)phenyl]-1,2-octanedione (OXE01), 3-benzoyl-7-methoxycoumarin, benzil dimethyl ketal, 2,2-dimethoxy-2-phenylacetophenone, oligomeric 1-chloro-4-propoxythioxanthone (Speedcure 7010), 5-dibenzosuberenone and mixtures thereof.

For the photocrosslinking of the polymers of the invention it is possible in one variant of the present invention likewise to use bifunctional photocrosslinkers based on azides, diazirines or maleimides.

The present invention also comprises a method for producing an electronic device which involves producing a dielectric layer, comprising steps a) to c) or consisting thereof:
a) deposition of a formulation which comprises or consists of at least one crosslinkable polymer with units with pendant oligodihydrocyclopentadienyl side groups, at least one photoinitiator and at least one organic solvent on a substrate,
b) removal of the solvent,
c) photocrosslinking of the resulting layer by actinic radiation.

In one embodiment, the crosslinkable polymer comprises at least 5 mol % of units with pendant oligodihydrocyclopentadienyl side groups.

In a further embodiment the crosslinkable polymer comprises at least 10 mol % of units with pendant oligodihydrocyclopentadienyl side groups.

In a further embodiment the crosslinkable polymer comprises at least 20 mol % of units with pendant oligodihydrocyclopentadienyl side groups.

In a further embodiment the crosslinkable polymer comprises at least 25 mol % of units with pendant oligodihydrocyclopentadienyl side groups.

The deposition of the dielectric layer produced in accordance with the invention may take place by methods customary in the art, preferably via spin coating, slot die coating, knife coating, ink jet, gravure printing, flexographic printing or spray coating.

In one variant of the present invention, the solvent is removed by baking at temperatures preferably between 50 and 200° C., more preferably between 70 and 100° C., enabling low-temperature processing on PET substrates.

In one variant of the present invention, the dielectric layer has a dry film layer thickness of between 100 and 2000 nm, preferably between 300 and 1000 nm.

The photocrosslinking is induced by actinic radiation—in one variant of the present invention, in a wavelength range between 100 and 800 nm, preferable between 250 and 600 nm, more preferably between 300 and 500 nm.

Typical radiation sources are Hg or Hg/Fe lamps or monochromatic radiation sources such as LEDs. The radiation dose necessary for the photocrosslinking of the polymer is situated in the range between 50 and 4000 mJ/cm$^2$, preferably between 100 and 1000 mJ/cm$^2$, more preferably 300-1000 mJ/cm$^2$. In principle the objective is to use radiation doses that are as low as possible.

In one variant of the present invention, the electronic device of the invention which comprises a dielectric layer having a crosslinkable polymer of the invention may be an OFET, a diode or a capacitor.

The device preferably comprises or is an OFET, consisting of a substrate, a source electrode and drain electrode, an organic semiconductor layer, a dielectric layer and a gate electrode.

Depending on the layer arrangement, a distinction is made between top gate and bottom gate OFETs, with the present invention relating to both configurations (see FIGS. 1 and 2).

A bottom gate OFET comprises a gate electrode on a substrate, a dielectric layer applied to the gate electrode, an organic semiconductor layer adjacent to the dielectric layer, and a drain electrode and source electrode, which are in contact with the semiconductor layer. Either the source and drain electrodes are deposited on the semiconductor layer (top contact) or, conversely, the semiconductor is applied to the source and drain electrodes (bottom contact).

In the top gate configuration, the layer arrangement is in reverse order. An organic semiconductor layer, which is deposited on a substrate and is in contact with a drain electrode and source electrode, is followed by a dielectric layer, on which a gate electrode is deposited.

The substrate used for an electronic device of the invention may be any of the materials commonly used for this purpose. In one variant of the present invention, glass or plastic is used. In one embodiment of the present invention, flexible polymeric films made of polyethylene terephthalate (PET), polyethylene naphthalate (PEN), polycarbonate (PC) or polyimide (PI) are the substrate used.

The semiconductor layer for the purposes of the present invention comprises a semiconducting organic material. The material may be a small molecule (monomer, oligomer), polymer or else a combination thereof. In analogy to the inorganic semiconductors, a distinction is made between n-type and p-type semiconductors according to the polarity of the majority charge carriers.

Examples of p-type semiconducting small molecules are oligoacenes such as 6,13-[bis-triisopropylsilylethynyl]pentacene (TIPS pentacene) or oligoheteroacenes such as 2,7-dioctyl[1]benzothieno[3,2-b][1]benzothiophene (C8-BTBT). Examples of p-type semiconducting polymers are polythiophenes such as poly-3-hexylthiophene (P3HT), 2,4-dimethyl[polytriarylamine] (PTAA), polyfluorenes, and also copolymers having repeating units which contain isoindigo or diketopyrrolopyrrole units (DPP).

An example of a small molecule having n-type semiconducting properties is the fullerene derivative [6,6]-phenyl-C61methyl butyrate (PCBM). Known n-type semiconductor polymers are copolymers which have repeating units comprising naphthalenedicarboxyimide, such as, for example, poly([n,n'-bis(2-octyldodecyl)-11-naphthalene-1,4,5,8-bis (dicarboximide)-2,6-diyl]-alt-5,5'-(2,2'-12-bithiophene)) (P(ND12OD-T2)).

In one variant of the present invention, the electronic device of the invention comprises electrodes which consist preferably of metal, more particularly Au, Ag, Cu or Al, or conductive polymer contacts (e.g. PEDOT:PSS).

BRIEF DESCRIPTION OF FIGURES

The drawings are not necessarily to scale. For reasons of clarity and for greater ease of representation, certain features of the invention may be shown with exaggerated size or in schematic form, and similarly, certain details of conventional or known elements may therefore not be shown.

Figure 1:
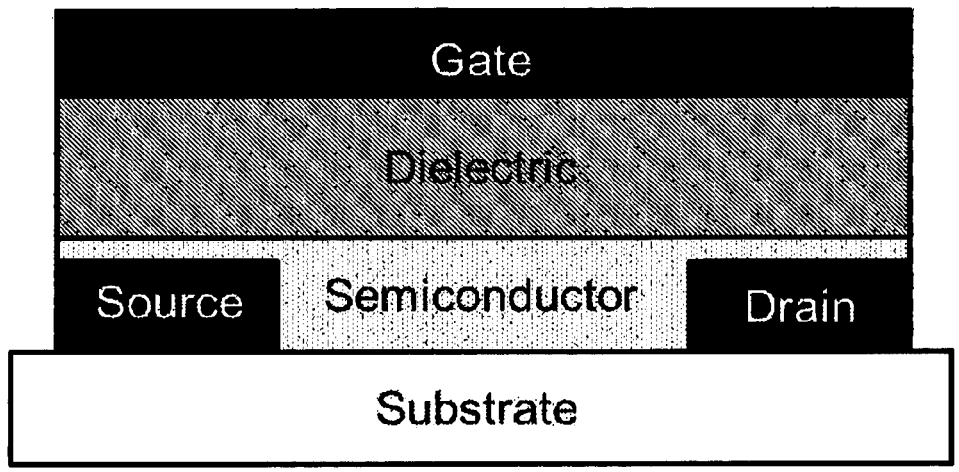
FIG. 1 shows the schematic structure of a top gate transistor (bottom contact).
Figure 2:
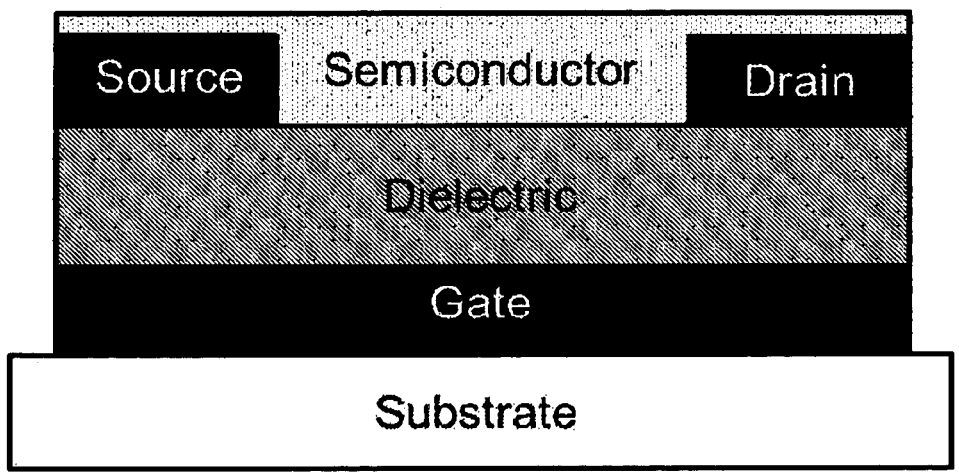
FIG. 2 shows the schematic structure of a bottom gate transistor (bottom contact).

The various embodiments of the present invention, as for example but not exclusively those of the various dependent claims, may be combined with one another in any desired way.

The invention is now elucidated with reference to the non-limiting examples below.

EXAMPLES

Example A1 Preparation of Polymer 1

Using a syringe technique, 20 ml of freshly distilled dicyclopentenyloxyethyl methacrylate (FA-512M, Hitachi Chemical) and 20 ml of THF were transferred under argon into a two-necked flask. Then 30 mg of 2,2'-azobisisobutyronitrile in the form of a THF solution were added, and the mixture was heated to 60° C. with stirring. After six hours, the reaction was discontinued by addition of 50 mg of butylated hydroxytoluene (BHT) and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 20.2%
Mn=219 000 g/mol, Mw=520 000 g/mol
$T_g$=61° C.

Example A2 Preparation of Polymer 2

Using a syringe technique, 20 ml of freshly distilled dicyclopentenyl methacrylate (CD535, Sartomer) and 20 ml of THF were transferred under argon into a two-necked flask. Then 40 mg of 2,2'-azobisisobutyronitrile in the form of a THF solution were added, and the mixture was heated to 50° C. with stirring. After ten hours, the reaction was discontinued by addition of 50 mg of butylated hydroxytoluene (BHT) and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 18.5%
Mn=89 600 g/mol, Mw=237 000 g/mol
$T_g$=178° C.

Example A3 Preparation of Polymer 3

Using a syringe technique, 10 ml of freshly distilled dicyclopentenyloxyethyl methacrylate (FA-512M, Hitachi Chemical), 10 ml of freshly distilled methyl methacrylate and 40 ml of THF were transferred under argon into a two-necked flask. Then 30 mg of 2,2'-azobisisobutyronitrile in the form of a THF solution were added, and the mixture was heated to 50° C. with stirring. After eight hours, the reaction was discontinued by addition of 50 mg of BHT and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 35%
Mn=87 700 g/mol, Mw=317 000 g/mol
$T_g$=94° C.
Repeating units in the polymer: FA-512M/MMA ratio 28:72 (determined via $^1$H-NMR)

Example A4 Preparation of Polymer 4

9 g of 5-methacryloyloxy-2,6-norbornanecarbolactone (NLAM, Kuraray) and also, using a syringe technique, 10 ml of freshly distilled dicyclopentenyloxyethyl methacrylate (FA-512M, Hitachi Chemical), and 40 ml of THF were transferred under argon into a two-necked flask. Then 30 mg of 2,2'-azobisisobutyronitrile in the form of a THF solution were added, and the mixture was heated to 50° C. with stirring. After eight hours, the reaction was discontinued by addition of 50 mg of BHT and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 15.3%
Mn=55 200 g/mol, Mw=158 000 g/mol
$T_g$=143° C.
Repeating units in the polymer: FA-512M/NLAM ratio 48:52 (determined via $^1$H-NMR)

Example A5 Preparation of Polymer 5

Using a syringe technique, 10 ml of freshly distilled dicyclopentenyloxyethyl methacrylate (FA-512M, Hitachi Chemical), 1.5 ml of freshly distilled octafluoropentyl methacrylate (OFPMA) and 40 ml of THF were transferred under argon into a two-necked flask. Then 30 mg of 2,2'-azobisisobutyronitrile in the form of a THF solution were added, and the mixture was heated to 50° C. with stirring. After eight hours, the reaction was discontinued by addition of 50 mg of BHT and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 19.8%
Mn=71 800 g/mol, Mw=201 000 g/mol
$T_g$=64° C.
Repeating units in the polymer: FA-512M/OFPMA ratio 80.5:19.5 (determined via $^1$H-NMR)

Example A6 Preparation of Polymer 6

Using a syringe technique, 10 ml of freshly distilled dicyclopentenyl methacrylate (CD535, Sartomer), 0.8 ml of freshly distilled stearyl methacrylate (SMA) and 40 ml of THF were transferred under argon into a two-necked flask.

Then 30 mg of 2,2'-azobisisobutyronitrile in the form of a THF solution were added, and the mixture was heated to 50° C. with stirring. After eight hours, the reaction was discontinued by addition of 50 mg of BHT and cooling to room temperature. The polymerization solution was precipitated from 1000 ml of methanol, and the polymer was isolated by filtration and dried under reduced pressure. The polymer was then dissolved again three times in 100 ml of THF and precipitated from 800 ml of methanol with addition of 20 mg of BHT each time.

Yield 16.3%
Mn=109 000 g/mol, Mw=319 000 g/mol
$T_g$=128° C.
Repeating units in the polymer: CD535/SMA ratio 91:9 (determined via $^1$H-NMR)

Example A7 Preparation of Polymer 7

In a single-necked flask, under nitrogen, 175 g of styrene-co-maleic anhydride (Xiran 28110, Polyscope, 28% MAn fraction, Mw=110 000) were dissolved in 450 ml of solvent naphtha. Then 75.11 g of hydroxydicyclopentadiene (Texmark) and 66.0 g of dicyclopentadiene were added and the reaction solution was stirred at 130° C. for four hours. Following addition of a further 230 ml of solvent naphtha, the reaction solution was stirred for a further four hours under reflux at 160° C. The batch was diluted additionally with 350 ml of xylene. The polymer solution was cooled to room temperature (RT) and 20 g of the solution was precipitated from 475 ml of isopropanol water. Following filtration and washing with 500 ml of isopropanol, the residue was dissolved twice in 25 ml of methyl ethyl ketone and precipitated from 500 ml of Shellsol D25.

the solvent was removed on a rotary evaporator and 80 ml of dried THF were added under argon. Using a syringe technique, the solution was subsequently added dropwise to the polymer solution in the first flask. After 48 hours the reaction was discontinued by precipitation from 1000 ml of isopropanol. The product was isolated by filtration and dried under reduced pressure. It was then dissolved again twice in 300 ml of THF and precipitated from 1000 ml of isopropanol.

Yield 41%
Mn=48 300 g/mol, Mw=116 000 g/mol
$T_g$=89° C.

Example B1 Preparation of Photocrosslinked Dielectric Layers of Polymer 1-8

A polymer solution admixed with photoinitiator was filtered through a 0.45 μm PTFE syringe filter and applied by spin coating at 1000 rpm for 30 s to a 25×25 mm glass substrate. After heating of the coated substrate on a hotplate at 90° C. for 60 s, the film was exposed with a 365 nm LED lighting unit (LED Cube 100, Dr. Hönle). The UV dose varied from 300-1000 mJ/cm$^2$ with a constant irradiation power of 100 mW/cm$^2$. In order to evaluate the degree of insolubility of the photocrosslinked film, the substrate, after exposure, was immersed for 60 s in a solvent bath corresponding to the process solvent, and then the film retention was ascertained. The film retention was determined from the ratio of the layer thickness of the dry films after and before immersion in the solvent bath. The layer thickness was determined with the aid of a surface profilometer (Surface Profiler 150 Veeco) by scratching the film and determining the step height.

| Polymer | Process solvent | Polymer concentration | Photoinitiator content (weight fraction polymer) | UV dose | Film retention |
|---|---|---|---|---|---|
| 1 | MAK | 120 mg/ml | 2% OXE02 | 300 mJ/cm$^2$ | 98% |
| 1 | MAK | 120 mg/ml | 6% ITX | 500 mJ/cm$^2$ | 94% |
| 2 | MAK | 100 mg/ml | 2% OXE02 | 300 mJ/cm$^{22}$ | 88% |
| 2 | MAK | 100 mg/ml | 4% SC7010 | 500 mJ/cm$^2$ | 94% |
| 4 | CP:BuAc 1:1 | 90 mg/ml | 4% OXE02 | 300 mJ/cm$^2$ | 90% |
| 5 | MAK | 110 mg/ml | 2% OXE02 | 300 mJ/cm$^2$ | 97% |
| 6 | MAK | 110 mg/ml | 2% OXE02 | 300 mJ/cm$^2$ | 96% |
| 7 | PGMEA | 90 mg/ml | 8% OXE02 | 1000 mJ/cm$^2$ | 81% |
| 8 | MAK | 80 mg/ml | 8% SC7010 | 2000 mJ/cm$^2$ | 90% |

MAK = methyl amyl ketone
CP = cyclopentanone
BuAc = n-butyl acetate
OXE02 (BASF) = 1-[9-ethyl-6-(2-methylbenzoyl)-9H-carbazol-3-yl]ethanone 1-(O-acetyloxime)
ITX = isopropylthioxanthone
SC7010 (Lambson) = oligomeric 1-chloro-4-propoxythioxanthone Yield 86.4%
Mn=73 100 g/mol, Mw=211 000 g/mol
$T_g$=147° C.

Example A8 Preparation of Polymer 8

In a first single-necked flask, 10.4 of polyvinylbenzyl chloride (Sigma Aldrich 182532, Mn=43 300 & Mw=79 600) were dissolved in 250 ml of dried THF at room temperature under argon and with stirring. In a second single-necked flask, 9.4 ml of hydroxydicyclopentadiene were transferred under argon and 43 ml of butyllithium (1.6 molar) in hexane were added dropwise using a syringe technique with stirring. After a reaction time of five hours, Example B2

Preparation of a Photopatterned Layer of Polymer 1

A 120 mg/ml solution of polymer 1 with 2% of photoinitiator OXE02 (weight fraction polymer) in methyl amyl ketone (MAK) was applied by spin coating to a 25×25 mm glass substrate. The film was heated on a hotplate at 90° C. for 60 s and was subsequently subjected to imagewise UV exposure through a shadow mask (LED 365 nm, 300 mJ/cm$^2$). Following immersion of the film for 60 s in a MAK solvent bath, the unexposed portion of the film was removed, leaving the imagewise-exposed, crosslinked portion.

Figure 3:
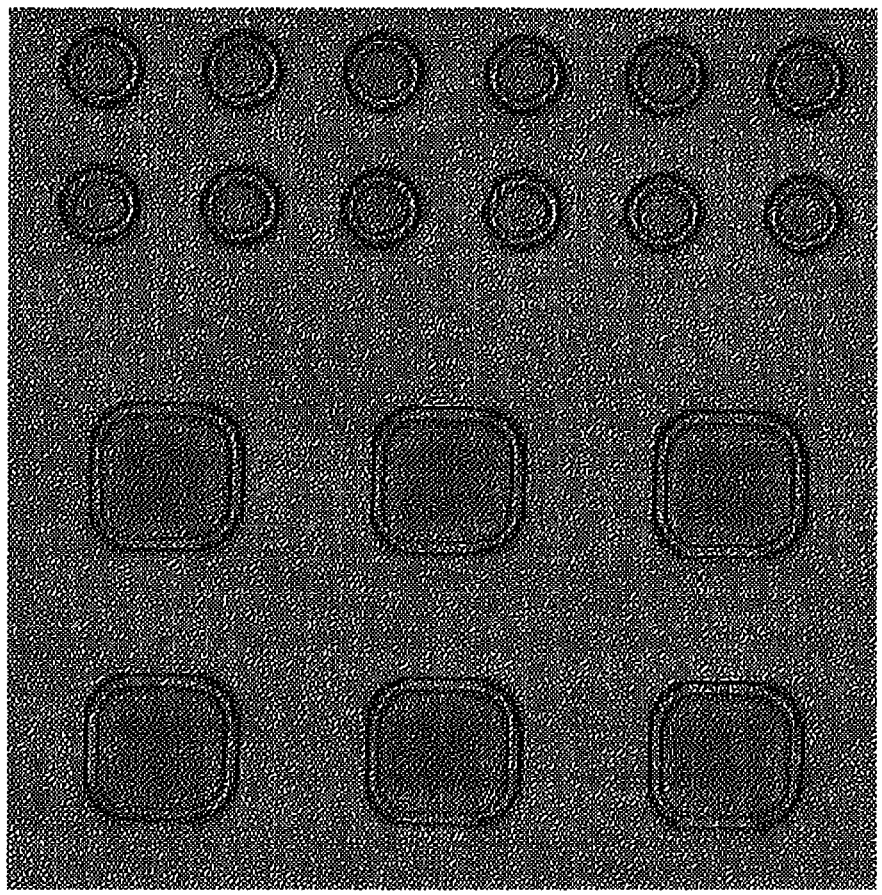
FIG. 3 shows a micrograph of a photopatterned layer based on a polymer of the invention.

FIG. 3 shows a micrograph in five-fold magnification of a photopatterned layer from example B2.

Example C1 Preparation of Capacitor Devices from Polymer 1-8

The substrate used was an indium tin oxide (ITO)-coated 25×25 mm glass, with the ITO layer (120 nm) serving as the back electrode. A 90-120 mg/ml polymer solution was filtered through a 0.45 pm PTFE syringe filter and applied to the substrate by spin coating at 1000 rpm for 30 s. Thereafter the substrate was heated on a hotplate at 90° C. for ten minutes. Finally, patterned counter-electrodes (50 nm) each with an area of 3 mm$^2$ were applied by thermal evaporation of gold (HHV Auto 306) with the aid of a shadow mask.

The capacitor devices were characterized electrically using a Cascade Microtech MS 150 Probe Station and an Agilent E4980A LCR meter.

| Polymer | Process solvent | Polymer concentration | Layer thickness | Permittivity at 20 Hz | Loss factor at 20 Hz |
|---|---|---|---|---|---|
| 1 | MAK | 110 mg/ml | 525 nm | 3.08 | 0.0063 |
| 2 | MAK | 100 mg/ml | 520 nm | 2.82 | 0.0013 |
| 3 | MAK | 110 mg/ml | 510 nm | 3.24 | 0.0181 |
| 4 | CP:BuAc 1:1 | 90 mg/ml | 485 nm | 3.56 | 0.0098 |
| 5 | MAK | 120 mg/ml | 580 nm | 3.03 | 0.0082 |
| 6 | MAK | 110 mg/ml | 595 nm | 2.85 | 0.0088 |
| 7 | PGMEA | 100 mg/ml | 620 nm | 3.25 | 0.0091 |
| 8 | MAK | 100 mg/ml | 535 nm | 4.56 | 0.0268 |

Example C2 Preparation of a Top Gate OFET with Polymer 1 as Dielectric Layer

The substrate used was a PET film with prepatterned source and drain electrodes (40 nm gold) (acquired from Fraunhofer IPM, Freiburg). The channel length was 10 μm and the channel width was 10 mm. An 8 mg/ml solution of the semiconductor polymer PDPP2T-TT-OD (Sigma Aldrich 791989) in xylene was filtered through a 0.45 μm PTFE syringe filter and applied to the film by spin coating at 1000 rpm (30 s). The substrate was subsequently heated on a hotplate at 90° C. for 60 s. A 110 mg/ml solution of polymer 1 with 2% of photoinitiator OXE02 (weight fraction polymer) in MAK was filtered through a 0.45 μm PTFE syringe filter and applied to the film by spin coating at 1000 rpm (30 s). The coated substrate was prebaked on a hotplate at 90° C. for 60 s. The substrate was subjected to UV exposure (LED 365 nm, 300 mJ/cm$^2$), followed by a postbake on a hotplate at 90° C. for 60 s. Subsequently the substrate was immersed for 60 s in a MAK bath, dried under a stream of nitrogen and heated on a hotplate at 90° C. for ten minutes. A patterned gate electrode (50 nm) was applied by thermal evaporation of gold (HHV Auto 306) using a shadow mask.

The transistor devices were characterized electrically using a Cascade Microtech MS 150 Probe Station and a Keithley 2612A SMU.

Figure 4:
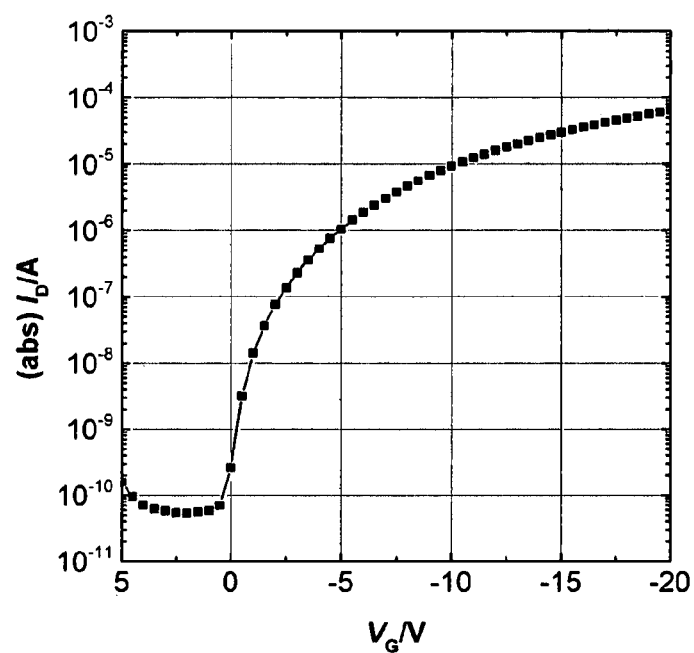
FIG. 4 shows the transfer characteristic of a top gate OFET with polymer 1.

FIG. 4 shows the transfer characteristic of a top gate OFET in the saturated range ($V_D$=−20 V). From the slope of the characteristic, a charge carrier mobility μsat=0.11 cm$^2$/Vs and an on/off ratio of 1.1*10$^6$ is found.

Example C3 Preparation of a Bottom Gate OFET with Polymer 6 as Dielectric Layer

The substrate used was an ITO-coated glass substrate, with the ITO layer serving as gate electrode. A 110 mg/ml solution of polymer 6 with 2% of OXE02 (weight fraction polymer) in MAK was filtered through a 0.45 μm PTFE syringe filter and applied to the ITO substrate by spin coating at 1000 rpm for 30 s. The coated substrate was prebaked on a hotplate at 90° C. for 60 s. Thereafter the substrate was subjected to UV exposure (LED 365 nm, 300 mJ/cm$^2$), followed by a postbake on a hotplate at 90° C. for 60 s. The substrate was subsequently immersed in a MAK bath for 60 s, dried under a stream of nitrogen and heated on a hotplate at 90° C. for ten minutes. The patterned source and drain electrodes (30 nm) were applied by thermal evaporation of gold (HHV Auto 306) with the aid of a shadow mask. The channel length was 100 pm and the channel width was 4 mm. An 8 mg/ml solution of the semiconductor polymer PDPP2T-TT-OD (Sigma Aldrich 791989) in xylene was filtered through a 0.45 μm PTFE syringe filter and applied to the substrate by spin coating at 1000 rpm (30 s). Lastly the substrate was heated on a hotplate at 90° C. for ten minutes.

The transistor devices were characterized electrically using a Cascade Microtech MS 150 Probe Station and a Keithley 2612A SMU.

Figure 5:
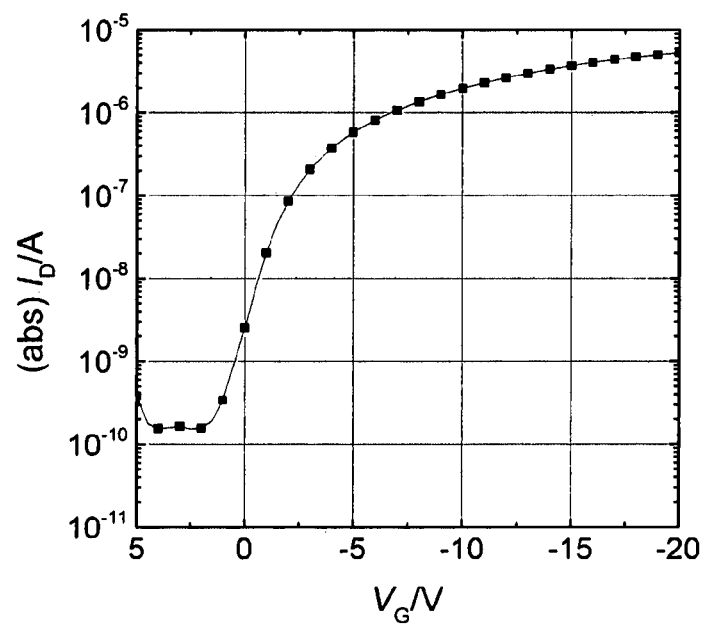
FIG. 5 shows the transfer characteristic of a bottom gate OFET with polymer 6.

FIG. 5 shows the transfer characteristic of a bottom gate OFET in the saturated range ($V_D$=−20 V). From the slope of the characteristic, a charge carrier mobility $\mu_{sat}$=0.07 cm$^2$/Vs and an on/off ratio of 3.4*10$^4$ is found.

Example C4 Preparation of a Top Gate OFET with Polymer 7 as Dielectric Layer

The substrate used was a PET film with prepatterned source and drain electrodes (40 nm gold) (acquired from Fraunhofer IPM, Freiburg). The channel length was 10 pm and the channel width was 10 mm. An 8 mg/ml solution of the semiconductor polymer PDPP2T-TT-OD (Sigma Aldrich 791989) in xylene was filtered through a 0.45 pm PTFE syringe filter and applied to the film by spin coating at 1000 rpm (30 s). The substrate was subsequently heated on a hotplate at 90° C. for 60 s. A 110 mg/ml solution of polymer 7 with 8% of photoinitiator OXE02 (weight fraction polymer) in PGMEA was filtered through a 0.45 μm PTFE syringe filter and applied to the film by spin coating at 1000 rpm (30 s). The coated substrate was prebaked on a hotplate at 90° C. for 60 s. The substrate was subjected to UV exposure (LED 365 nm, 1000 mJ/cm$^2$), followed by a postbake on a hotplate at 90° C. for 60 s. Subsequently the substrate was immersed for 60 s in a MAK bath, dried under a stream of nitrogen and heated on a hotplate at 90° C. for ten minutes. A patterned gate electrode (50 nm) was applied by thermal evaporation of gold (HHV Auto 306) using a shadow mask.

The transistor devices were characterized electrically using a Cascade Microtech MS 150 Probe Station and a Keithley 2612A SMU.

Figure 6:
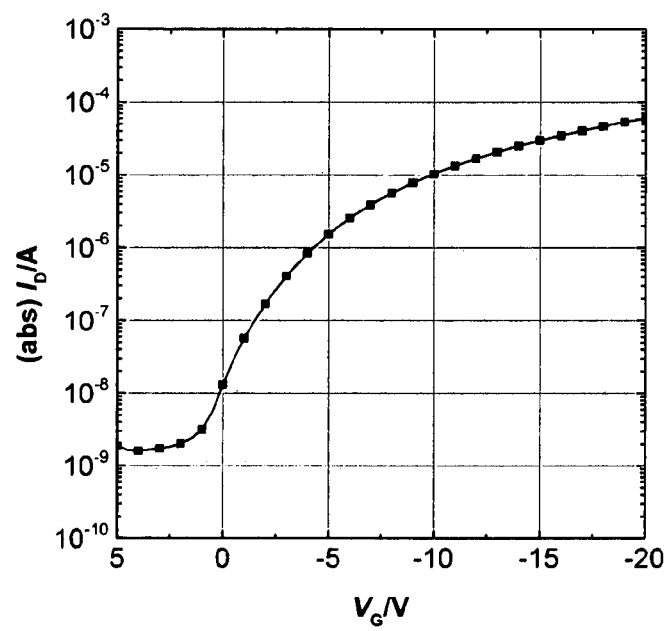
FIG. 6 shows the transfer characteristic of a top gate OFET with polymer 7.

FIG. 6 shows the transfer characteristic of a top gate OFET in the saturated range ($V_D$=−20 V). From the slope of the characteristic, a charge carrier mobility $\mu_{sat}$=0.096 cm$^2$/Vs and an on/off ratio of 3.8*10$^4$ is found.

Example C5 Preparation of a Bottom Gate OFET with Polymer 7 as Dielectric Layer

The substrate used was an ITO-coated glass substrate, with the ITO layer serving as gate electrode. A 110 mg/ml solution of polymer 7 with 8% of OXE02 (weight fraction polymer) in MAK was filtered through a 0.45 μm PTFE syringe filter and applied to the ITO substrate by spin coating at 1000 rpm for 30 s. The coated substrate was prebaked on a hotplate at 90° C. for 60 s. Thereafter the substrate was subjected to UV exposure (LED 365 nm, 1000 mJ/cm$^2$), followed by a postbake on a hotplate at 90° C. for 60 s. The substrate was subsequently immersed in a MAK bath for 60 s, dried under a stream of nitrogen and heated on a hotplate at 90° C. for ten minutes. The patterned source and drain electrodes (30 nm) were applied by thermal evaporation of gold (HHV Auto 306) with the aid of a shadow mask. The channel length was 100 pm and the channel width was 4 mm. An 8 mg/ml solution of the semiconductor polymer PDPP2T-TT-OD (Sigma Aldrich 791989) in xylene was filtered through a 0.45 μm PTFE syringe filter and applied to the film by spin coating at 1000 rpm (30 s). Lastly the substrate was heated on a hotplate at 90° C. for ten minutes.

The transistor devices were characterized electrically using a Cascade Microtech MS 150 Probe Station and a Keithley 2612A SMU.

Figure 7:
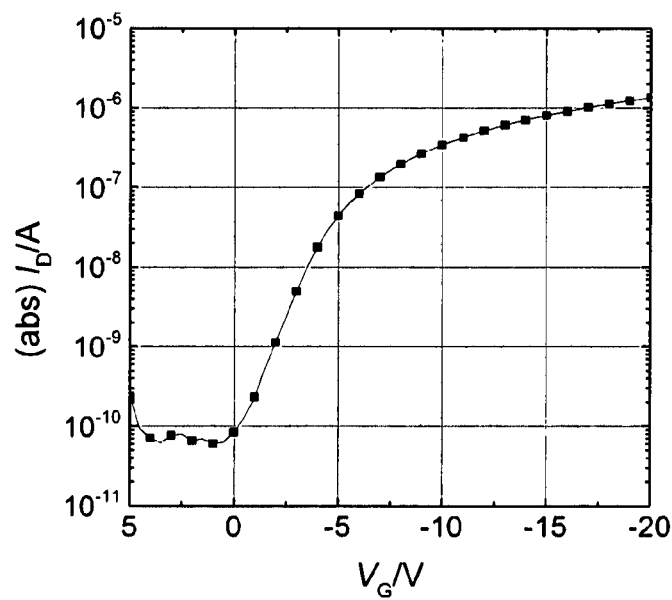
FIG. 7 shows the transfer characteristic of a bottom gate OFET with polymer 7.

FIG. 7 shows the transfer characteristic of a bottom gate OFET in the saturated range ($V_D$=−20 V). From the slope of the characteristic, a charge carrier mobility $\mu_{sat}$=0.02 cm$^2$/Vs and an on/off ratio of 2.2*10$^4$ is found.

The invention claimed is:

1. A composition for providing a dielectric layer in an electronic device, the composition comprising:

a polymer containing one or more units, wherein at least 50 mol% of the total number of units in the polymer are the following units (A) with crosslinkable side groups,

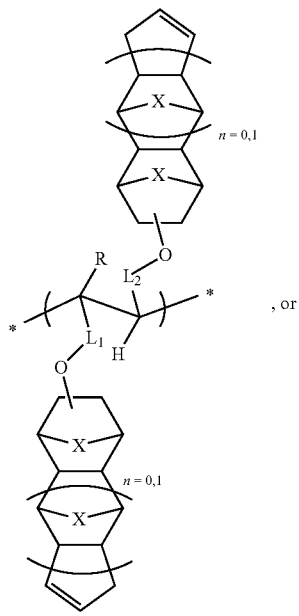

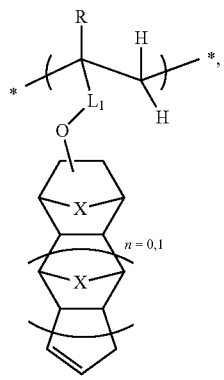

in which

X independently at each occurrence is a methylene group or oxygen,

R is H,

L$_1$ is a benzyl unit,

L$_2$ is a divalent group which connects the polymer chain to the side group, and n is 0.

2. A composition for providing a dielectric layer in an electronic device, the composition comprising:

a polymer containing one or more units, wherein at least 50 mol% of the total number of units in the polymer are the following units (A) with crosslinkable side groups,

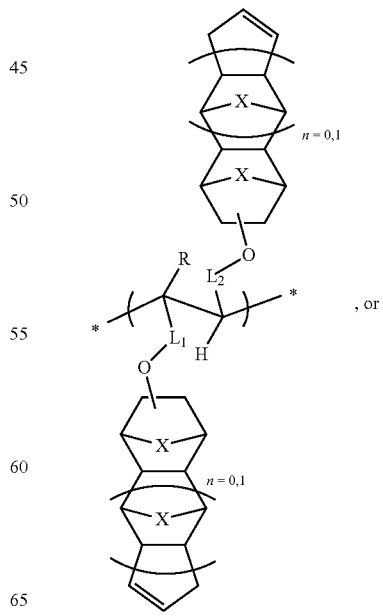

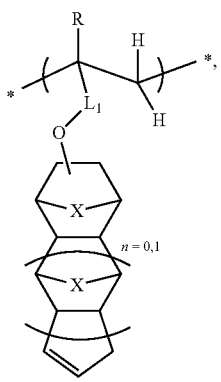

in which
- X independently at each occurrence is a methylene group or oxygen,
- R independently at each occurrence is a methyl group or hydrogen,
- $L_1$ is a divalent group which connects the polymer chain to the side group, and
- $L_2$ is a divalent group which connects the polymer chain to the side group; and independently of the unit (A) the polymer comprises at least one second unit selected from

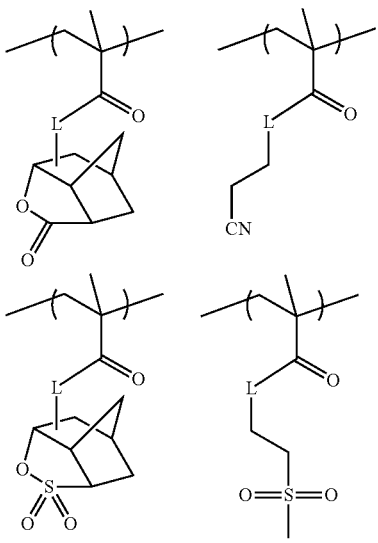

and mixtures thereof, where
L in each case is ethyloxy, isopropyloxy or ethylamidoxy or not present.

3. An electronic device comprising:
at least one dielectric layer; and
an organic semiconductor layer which is in contact with the at least one dielectric layer, wherein the at least one dielectric layer comprises:
a) a crosslinked polymer containing one or more units, wherein at least 25 mol% of the total number of units in the polymer are derived from the following units (A) with crosslinkable side groups,

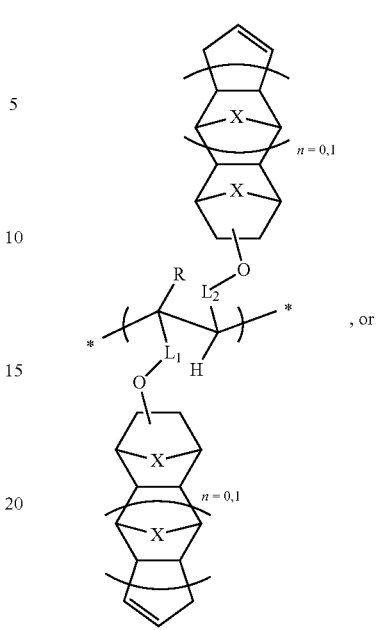

, or

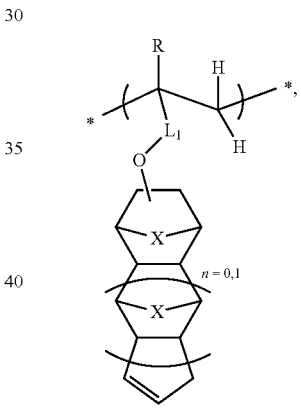

in which
- X independently at each occurrence is a methylene group or oxygen,
- R independently at each occurrence is a methyl group or hydrogen,
- $L_1$ is a divalent group which connects the polymer chain to the side group, and
- $L_2$ is a divalent group which connects the polymer chain to the side group.

4. An electronic device comprising an organic field-effect transistor in top gate configuration or in bottom gate configuration and at least one dielectric layer, the at least one dielectric layer comprising:
a) a crosslinked polymer containing one or more units, wherein at least 25 mol% of the total number of units in the polymer are derived from the following units (A) with crosslinkable side groups,

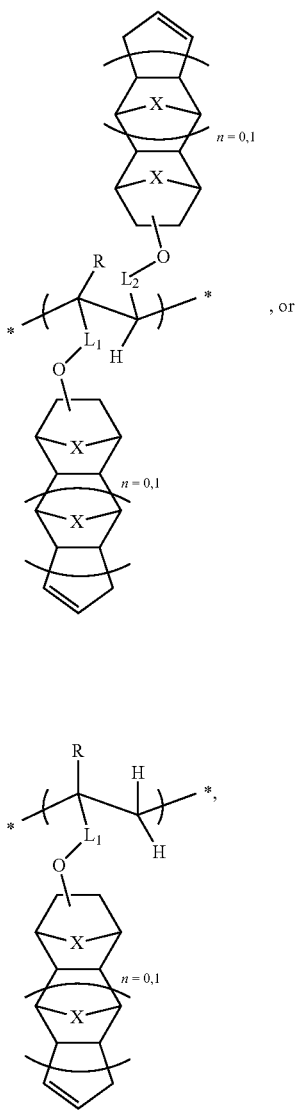

, or in which
X independently at each occurrence is a methylene group or oxygen,
R independently at each occurrence is a methyl group or hydrogen,
$L_1$ is a divalent group which connects the polymer chain to the side group, and
$L_2$ is a divalent group which connects the polymer chain to the side group.

5. Method for preparing an electronic device which has at least one dielectric layer, the preparation of the dielectric layer comprising:

a) deposition of a formulation on a substrate, the formulation comprising:

i) at least one polymer containing one or more units, wherein at least 5 mol% of the total number of units in the at least one polymer are the following units (A) with crosslinkable side groups,

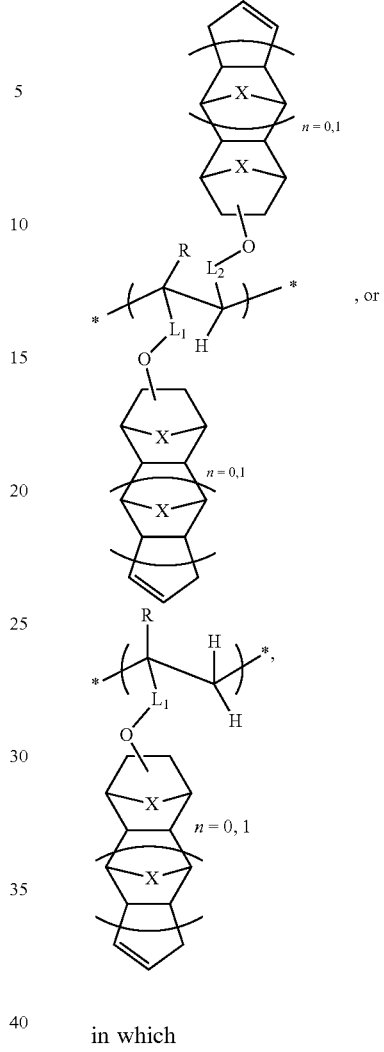

, or in which
X independently at each occurrence is a methylene group or oxygen,
R independently at each occurrence is a methyl group or hydrogen,
L1 is a divalent group which connects the polymer chain to the side group, and
L2 is a divalent group which connects the polymer chain to the side group, and the at least one polymer further contains one or more of the following units:

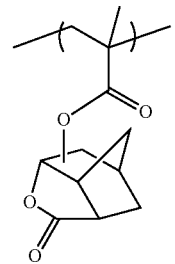 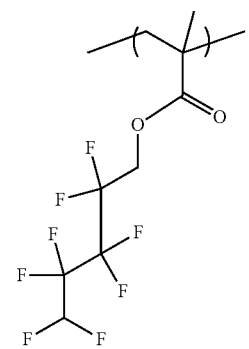

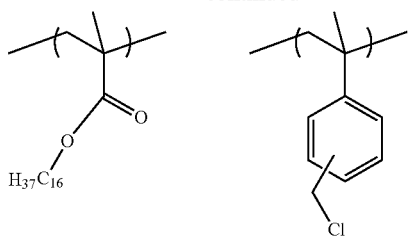

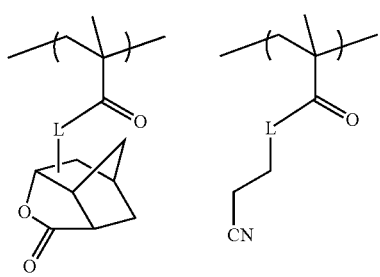

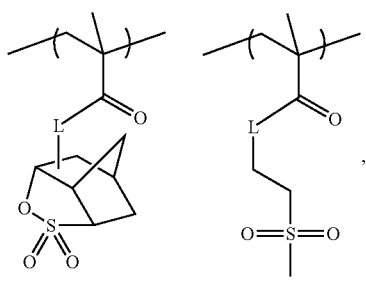

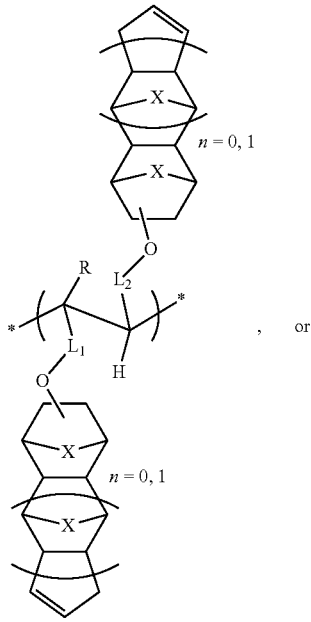

where L is ethyloxy, isopropyloxy or ethylamidoxy or not present, ii) at least one photoinitiator, and iii) at least one organic solvent, removing the solvent, and photocrosslinking of the resulting layer by actinic radiation.

6. The method according to 4, wherein the at least one polymer contains at least 50 mol% of the units (A).

7. Electronic device according to claim 3, characterized in that it comprises a thin-film capacitor.

8. Composition for providing a dielectric layer in an electronic device which composition comprises a polymer containing one or more units, wherein at least 25 mol% of the total number of units in the polymer are the following units (A) with crosslinkable side groups, in which X independently at each occurrence is a methylene group or oxygen, R is H, $L_1$ is a benzyl unit which connects the polymer chain to the side group, $L_2$ is a divalent group which connects the polymer chain to the side group, and n 0.

9. Composition for providing a dielectric layer in an electronic device, the composition comprising:

a polymer containing one or more units, wherein at least 25 mol% of the total number of units in the polymer are the following units (A) with crosslinkable side groups,

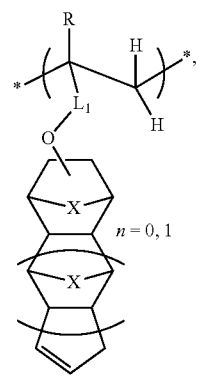

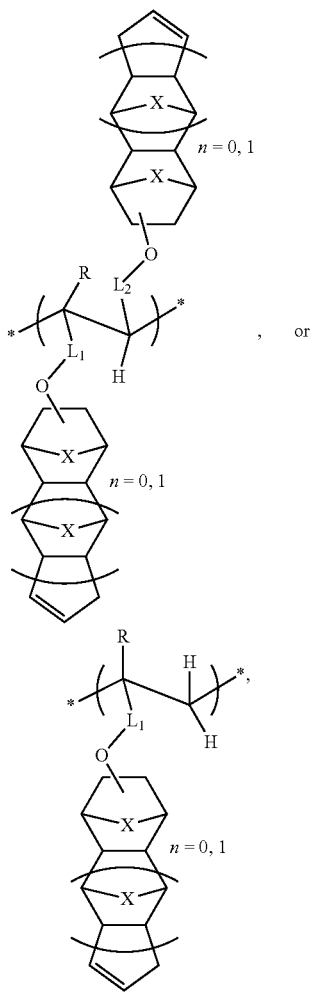

in which
- X independently at each occurrence is a methylene group or oxygen,
- R independently at each occurrence is a methyl group or hydrogen,
- $L_1$ is a divalent group which connects the polymer chain to the side group, and
- $L_2$ is a divalent group which connects the polymer chain to the side group;

and the polymer further containing at least one second unit selected from

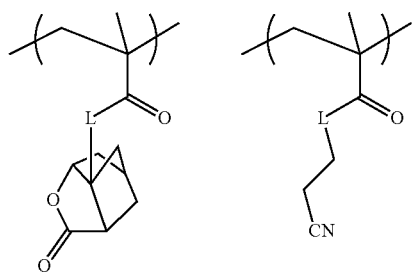

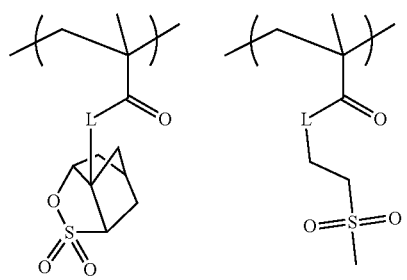

and mixtures thereof, where

L in each case is ethyloxy, isopropyloxy or ethylamidoxy or not present.

10. An electronic device comprising at least one dielectric layer and an organic semiconductor layer which is in contact with the dielectric layer, wherein the dielectric layer comprises:

a) a crosslinked polymer containing one or more units, wherein at least 25 mol% of the total number of units in the polymer are derived from the following units (A) with crosslinkable side groups,

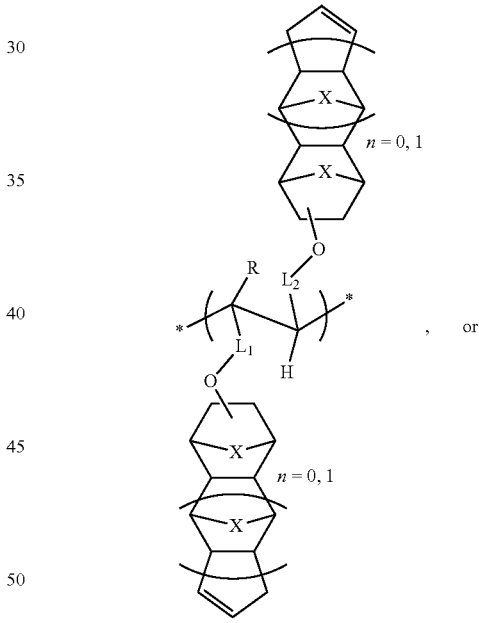

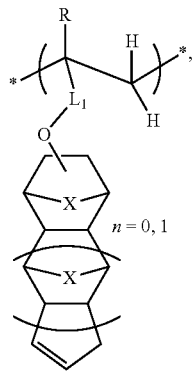

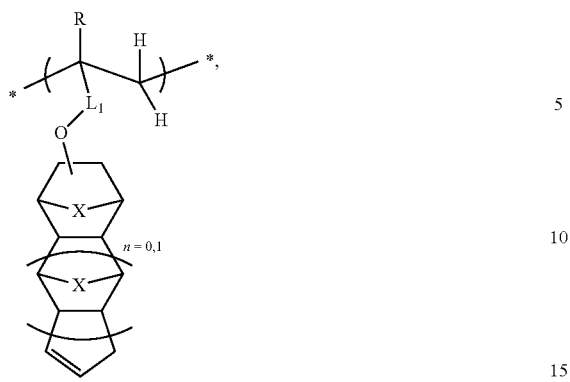
in which
- X independently at each occurrence is a methylene group or oxygen,
- R independently at each occurrence is a methyl group or hydrogen,
- $L_1$ is a divalent group which connects the polymer chain to the side group, and
- $L_2$ is a divalent group which connects the polymer chain to the side group.
* * * * *